(12) United States Patent
Chen et al.

(10) Patent No.: US 9,934,745 B2
(45) Date of Patent: Apr. 3, 2018

(54) GOA PANEL CIRCUIT APPLIED FOR IN CELL TYPE TOUCH DISPLAY PANEL

(71) Applicant: Wuhan China Star Optoelectronics Technology Co., Ltd., Wuhan (CN)

(72) Inventors: Caiqin Chen, Wuhan (CN); Mang Zhao, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 273 days.

(21) Appl. No.: 14/917,568

(22) PCT Filed: Jan. 29, 2016

(86) PCT No.: PCT/CN2016/072850
§ 371 (c)(1),
(2) Date: Mar. 8, 2016

(87) PCT Pub. No.: WO2017/107295
PCT Pub. Date: Jun. 29, 2017

(65) Prior Publication Data
US 2018/0059829 A1    Mar. 1, 2018

(30) Foreign Application Priority Data
Dec. 25, 2015   (CN) .......................... 2015 1 1003688

(51) Int. Cl.
*G09G 3/36* (2006.01)
*G06F 3/041* (2006.01)
(Continued)

(52) U.S. Cl.
CPC ....... *G09G 3/3677* (2013.01); *G02F 1/13454* (2013.01); *G06F 3/0412* (2013.01);
(Continued)

(58) Field of Classification Search
CPC ................ G11C 19/28; G02F 1/13454; G09G 2310/0283; G09G 2310/0286; G09G 2300/0408; G09G 2310/0291
See application file for complete search history.

(56) References Cited

U.S. PATENT DOCUMENTS

2015/0228354 A1* 8/2015 Qing ....................... G11C 19/28
345/100
2015/0243237 A1* 8/2015 Li ........................ G11C 19/184
345/100
(Continued)

FOREIGN PATENT DOCUMENTS

CN       104795041 A       7/2015
CN       105118466 A      12/2015

*Primary Examiner* — Sanjiv D Patel
(74) *Attorney, Agent, or Firm* — Leong C. Lei

(57) ABSTRACT

The present invention provides a GOA circuit applied for the In Cell type touch display panel. The third transmission gate (TG3) comprising the second P-type thin film transistor (T2) and the third N-type thin film transistor (T3), the first P-type thin film transistor (T1) and the fourth N-type thin film transistor (T4) are added in the output buffer module (600), and the touch control signal (TCK) and the inverted touch control signal (XTCK) are introduced to control the working status of the output buffer module (600). Thus, in the touch scan stage, the third transmission gate (TG3) is deactivated, and the first, the fourth thin film transistors (T1, T4) are activated, and the gate scan driving signal output end (Gate(N)) is floating, and similarly jumps between high, low voltage levels along with that the touch scan driving signal jumps between high, low voltage levels.

13 Claims, 9 Drawing Sheets

(51) Int. Cl.
*G02F 1/1345* (2006.01)
*G11C 19/28* (2006.01)
(52) U.S. Cl.
CPC ........... *G09G 3/3659* (2013.01); *G11C 19/28* (2013.01); *G09G 2300/0408* (2013.01); *G09G 2310/0283* (2013.01); *G09G 2310/0286* (2013.01); *G09G 2310/0289* (2013.01); *G09G 2310/0291* (2013.01); *G09G 2310/08* (2013.01)

(56) References Cited

U.S. PATENT DOCUMENTS

| | | | |
|---|---|---|---|
| 2015/0248867 A1* | 9/2015 | Tan | G09G 3/3648 345/100 |
| 2016/0247477 A1* | 8/2016 | Hu | G09G 3/36 |
| 2016/0307513 A1* | 10/2016 | Nakagawa | G09G 3/3266 |
| 2016/0328076 A1* | 11/2016 | Pan | G06F 3/0416 |
| 2016/0351112 A1* | 12/2016 | Qing | G09G 3/20 |
| 2016/0365050 A1* | 12/2016 | Qing | G09G 3/3677 |
| 2017/0039973 A1* | 2/2017 | Huang | G09G 3/36 |
| 2017/0200408 A1* | 7/2017 | Zhang | G09G 3/2092 |

* cited by examiner

GOA PANEL CIRCUIT APPLIED FOR IN CELL TYPE TOUCH DISPLAY PANEL

FIELD OF THE INVENTION

The present invention relates to a display technology field, and more particularly to a GOA circuit applied for an In Cell type touch display panel.

BACKGROUND OF THE INVENTION

The GOA (Gate Driver on Array) technology, i.e. the array substrate row driving technology is to utilize the array manufacture process of the Thin Film Transistor (TFT) liquid crystal display to manufacture the gate driving circuit on the Thin Film Transistor array substrate for realizing the driving way of scanning the gates row by row. It possesses advantages of reducing the production cost and realizing the panel narrow frame design, and is utilized by many kinds of displays. The GOA circuit has two basic functions: the first is to output the scan driving circuit for driving the gate lines in the panel to activate the TFTs in the display areas and to charge the pixels; the second is the shift register function. When the output of one scan driving signal is accomplished, the output of the next scan driving signal is performed with the control of the clock signal, and the transfer carries on in sequence.

The embedded touch control technology is to combine the touch control panel and the display panel as one, and to merge the function of the touch control panel into the liquid crystal panel to make the liquid crystal panel equipped with functions of display and sensing the touch control inputs at the same time. With the rapid development of the display technology, the touch control display panel has been widely applied and accepted, used by the people. For example, the smart phone, the flat panel computer and etc. all use the touch control display panel.

The present embedded touch control technology can be categorized into two types: one is that the touch control circuit is on the liquid crystal cell (On Cell), and the other is that the touch control circuit is inside the liquid crystal cell (In Cell).

The In Cell touch display panel according to prior art performs function of sensing after the normal display is completed in each frame of image. Namely, the touch scan signal is on after all the respective GOA units of the GOA circuit accomplish outputting the gate scan driving signals to start sensing.

FIG. 1 shows a GOA circuit applied for an In Cell type touch display panel, comprising GOA units of a plurality of stages which are cascade coupled, and the GOA unit of each stage comprises: a forward-backward scan control module 100, a control input module 200, a reset module 300, a latch module 400, a NAND gate signal process module 500 and an output buffer module 600.

The forward-backward scan control module 100 is employed to select the stage transfer signals of the former, latter stages to realize the forward or backward scan driving. The control input module 200 is employed to control the input of the stage transfer signal to achieve the charge to the first node Q(N). The reset module 300 is employed to perform clear zero process to the first node Q(N). The latch module 400 is employed to latch the stage transfer signal. The NAND gate signal process module 500 is employed to NAND process to the latched stage transfer signal and clock signal to generate the gate scan driving signal of the stage; the output buffer module 600 comprises inverters of odd numbers in series, which are employed to enhance the driving ability of the gate scan driving signal to reduce the RC Loading.

Specifically, N is set to be a positive integer, and except the GOA unit of the first stage and the GOA unit of the last stage, in the GOA unit of the Nth stage:

the forward-backward scan control module 100 comprises: a first transmission gate TG1, and a low voltage level control end of the first transmission gate TG1 receives a first direct current control signal U2D, and a high voltage level control end receives a second direct current control signal D2U, and an input end is electrically coupled to a first node Q(N−1) of the former N−1th GOA unit, and an output end is electrically coupled to an input end of a first clock control inverter TF1; and a second transmission gate TG2, and a high voltage level control end of the second transmission gate TG2 receives the first direct current control signal U2D, and a low voltage level control end receives the second direct current control signal D2U, and an input end is electrically coupled to a first node Q(N+1) of the latter N+1th GOA unit, and an output end is electrically coupled to the input end of a first clock control inverter TF1; a voltage level of the first node Q(N−1) of the former N−1th GOA unit is employed to be a forward scan stage transfer signal, and a voltage level of the first node Q(N+1) of the latter N+1th GOA unit is employed to be a backward scan stage transfer signal;

the control input module 200 comprises: a first clock control inverter TF1, and a high voltage level control end of the first clock control inverter TF1 is electrically coupled to a Mth clock signal CK(M), and a low voltage level control end is electrically coupled to a Mth inverted clock signal XCK(M), and an output end is electrically coupled to a second node P(N);

the reset module 300 comprises: a first P-type thin film transistor T1, and a gate of the first P-type thin film transistor T1 receives a reset signal Reset, and a source receives a constant high voltage level VGH, and a drain is electrically coupled to the second node P(N);

the latch module 400 comprises: a second clock control inverter TF2, and a low voltage level control end of the second clock control inverter TF2 is electrically coupled to the Mth clock signal CK(M), and a high voltage level control end is electrically coupled to the Mth inverted clock signal XCK(M), and an input end is electrically coupled to the first node Q(N), and an output end is electrically coupled to the second node P(N); and a first inverter IN1, and an input end of the first inverter IN1 is electrically coupled to the second node P(N), and an output end is electrically coupled to the first node Q(N);

the NAND gate signal process module 500 comprises: a NAND gate NAND, and a first input end of the NAND gate NAND is electrically coupled to the first node Q(N), and a second input end receives a M+2th clock signal, and an output end is electrically coupled to an input end of a second inverter IN2;

the output buffer module 600 comprises: the second inverter IN2, and an output end of the second inverter IN2 is electrically coupled to an input end of the third inverter IN3; the third inverter IN3, and an output end of the third inverter IN3 is electrically coupled to an input end of a fourth inverter IN4; and the fourth inverter IN4, an output end of the fourth inverter IN4 is electrically coupled to a gate scan driving signal output end Gate(N).

The working process of the GOA circuit applied for an In Cell type touch display panel according to prior art in the normal display stage is: the forward scan is illustrated, and as the voltage level of the first node Q(N−1) of the former N−1th GOA unit is high, the Mth clock signal CK(M) provides high voltage level, and the first node Q(N) is charged to be high voltage level; after the Mth clock signal CK(M) is changed to be low voltage level, the first node Q(N) is latched by the latch module 300, and as the high voltage level of the M+2th clock signal CK(M+2) comes, the gate scan driving signal output end Gate(N) outputs high voltage level; after the M+2th clock signal CK(M+2) is changed to be low voltage level, the gate scan driving signal output end Gate(N) steadily outputs low voltage level.

However, in the touch scan stage, all the signal lines are overlapped with a pulse changing along with the touch driving signal. After the normal display of the touch display panel is finished, the touch scan is performed, the gate scan driving signal output end Gate(N) receives the constant low voltage level, and then the constant low voltage level changes along with the jump and change of the touch driving signal, and the gate scan driving signal also changes along the change of the touch driving signal. Such work of the touch scan panel requires performing waveform process to the gate scan driving signal in the touch scan stage with the Integrated Circuit (IC), and results in larger loading of the IC.

SUMMARY OF THE INVENTION

An objective of the present invention is to provide a GOA circuit applied for an In Cell type touch display panel which can reduce the loading of the IC for the signal process in the touch scan stage to promote the working efficiency of the GOA circuit.

For realizing the aforesaid objective, the present invention provides a GOA circuit applied for an In Cell type touch display panel, comprising GOA units of a plurality of stages which are cascade coupled, and the GOA unit of each stage comprises: a forward-backward scan control module, a control input module, a reset module, a latch module, a NAND gate signal process module and an output buffer module;

N is set to be a positive integer, and except the GOA unit of the first stage and the GOA unit of the last stage, in the GOA unit of the Nth stage:

the forward-backward scan control module comprises: a first transmission gate, and a low voltage level control end of the first transmission gate receives a first direct current control signal, and a high voltage level control end receives a second direct current control signal, and an input end is electrically coupled to a first node of the former N−1th GOA unit, and an output end is electrically coupled to the control input module; and a second transmission gate, and a high voltage level control end of the second transmission gate receives the first direct current control signal, and a low voltage level control end receives the second direct current control signal, and an input end is electrically coupled to a first node of the latter N+1th GOA unit, and an output end is electrically coupled to the control input module; a voltage level of the first node of the former N−1th GOA unit is employed to be a forward scan stage transfer signal, and a voltage level of the first node of the latter N+1th GOA unit is employed to be a backward scan stage transfer signal;

the control input module comprises: a first clock control inverter, and a high voltage level control end of the first clock control inverter receives a Mth clock signal, and a low voltage level control end receives a Mth inverted clock signal, and an input end is electrically coupled to the output end of the first transmission gate and the output end of the second transmission gate, and an output end is electrically coupled to a second node;

the reset module comprises: an eleventh P-type thin film transistor, and a gate of the eleventh P-type thin film transistor receives a reset signal, and a source receives a constant high voltage level, and a drain is electrically coupled to the second node;

the latch module comprises: a second clock control inverter, and a low voltage level control end of the second clock control inverter receives the Mth clock signal, and a high voltage level control end receives the Mth inverted clock signal, and an input end is electrically coupled to the first node, and an output end is electrically coupled to the second node; and a first inverter, and an input end of the first inverter is electrically coupled to the second node, and an output end is electrically coupled to the first node;

the NAND gate signal process module comprises: a NAND gate, and a first input end of the NAND gate is electrically coupled to the first node, and a second input end receives a M+2th clock signal, and an output end is electrically coupled to the output buffer module;

the output buffer module comprises:

a second inverter comprising a seventh P-type thin film transistor and an eighth N-type thin film transistor; and a gate of the seventh P-type thin film transistor is electrically coupled to a gate of the eighth N-type thin film transistor to be an input end of the second inverter, and electrically coupled to an output end of the NAND gate, and a drain of the seventh P-type thin film transistor is electrically coupled to a drain of the eighth N-type thin film transistor to be an output end of the second inverter, and a source of the seventh P-type thin film transistor receives a constant high voltage level, and a source of the eighth N-type thin film transistor receives a constant low voltage level;

a third transmission gate comprising a second P-type thin film transistor and a third N-type thin film transistor; a gate of the second P-type thin film transistor is employed to be a low voltage level control end of the third transmission gate to receive a touch control signal, and a gate of the third N-type thin film transistor is employed to be a high voltage level control end of the of the third transmission gate to receive an inverted touch control signal, and a source of the second P-type thin film transistor is electrically coupled to a source of the third N-type thin film transistor, and a drain of the second P-type thin film transistor and a drain of the third N-type thin film transistor are electrically coupled to be an input end and an output end of the third transmission gate, respectively;

a sixth P-type thin film transistor, and a gate of the sixth P-type thin film transistor is electrically coupled to the output end of the second inverter, and a source receives the constant high voltage level, and a drain is electrically coupled to the drain of the second P-type thin film transistor, the drain of the third N-type thin film transistor, and a gate of a ninth P-type thin film transistor;

a first P-type thin film transistor, and a gate of the first P-type thin film transistor receives the inverted touch control signal, and a source receives the constant high voltage level, and a drain is electrically coupled to the drain of the second P-type thin film transistor, the drain of the third N-type thin film transistor, and the gate of the ninth P-type thin film transistor;

a fourth N-type thin film transistor, and a gate of the fourth N-type thin film transistor receives the touch control signal, and a source receives the constant low voltage level, and a drain is electrically coupled to the source of the second P-type thin film transistor, the source of the third N-type thin film transistor, and a gate of a tenth N-type thin film transistor;

a fifth N-type thin film transistor, and a gate of the fifth N-type thin film transistor is electrically coupled to the output end of the second inverter, and a source receives the constant low voltage level, and a drain is electrically coupled to the source of the second P-type thin film transistor, the source of the third N-type thin film transistor, and the gate of the tenth N-type thin film transistor;

the ninth P-type thin film transistor, and a source of the ninth P-type thin film transistor receives the constant high voltage level, and a drain is electrically coupled to a gate scan driving signal output end;

the tenth N-type thin film transistor, and a source of the tenth N-type thin film transistor receives the constant low voltage level, and a drain is electrically coupled to the gate scan driving signal output end;

the voltage levels of the first direct current control signal and the second direct current control signal are opposite;

in a normal display stage, the touch control signal is low voltage level, and the inverted touch control signal is high voltage level, and the touch scan driving signal provides low voltage level; in a touch scan stage, the touch control signal is high voltage level, and the inverted touch control signal is low voltage level, and the touch scan driving signal provides a periodic pulse signal, and the gate scan driving signal output end is floating, and the outputted gate scan driving signal appears in a high impedance state, and jumps between high, low voltage levels along with that the touch scan driving signal jumps between high, low voltage levels.

In the first stage GOA unit, the input end of the first transmission gate receives a start signal of the circuit.

In the last stage GOA unit, the input end of the second transmission gate receives a start signal of the circuit.

The first inverter comprises: an N-type thin film transistor and a P-type thin film transistor, and a gate of the N-type thin film transistor is electrically coupled to a gate of the P-type thin film transistor to be an input end, and a drain of the N-type thin film transistor is electrically coupled to a drain of the P-type thin film transistor to be an output end, and a source of the N-type thin film transistor receives the constant low voltage level, and a drain of the P-type thin film transistor receives the constant high voltage level.

Both the first clock control inverter and the second clock control inverter comprise: two N-type thin film transistors coupled in series and two P-type thin film transistors coupled in series, wherein a gate of one P-type thin film transistor is employed to be the low voltage level control end of the clock control inverter, and a source receives the constant high voltage level, and a drain is electrically coupled to a source of the other P-type thin film transistor; a gate of one N-type thin film transistor is employed to be the high voltage level control end of the clock control inverter, and a source receives the constant low voltage level, and a drain is electrically coupled to a source of the other N-type thin film transistor; a gate of the other N-type thin film transistor is electrically coupled to a gate of the other P-type thin film transistor to be the input end of the clock control inverter, and a drain of the other N-type thin film transistor is electrically coupled to a drain of the other P-type thin film transistor to be the output end of the clock control inverter.

Both the first transmission gate and the second transmission gate comprises: a N-type thin film transistor and a P-type thin film transistor which are oppositely located, and a gate of the N-type thin film transistor is employed to be the high voltage level control end of the transmission gate, and a gate of the P-type thin film transistor is employed to be the low voltage level control end of the transmission gate, and a source of the N-type thin film transistor is electrically coupled to a source of the P-type thin film transistor to be the input end of the transmission gate, and a drain of the N-type thin film transistor is electrically coupled to a drain of the P-type thin film transistor to be the output end of the transmission gate.

The NAND gate comprises: two N-type thin film transistors in series and two P-type thin film transistors oppositely located thereto, wherein a gate of the first P-type thin film transistor is electrically coupled to a gate of the first N-type thin film transistor to be the first input end of the NAND gate, and a gate of the second P-type thin film transistor is electrically coupled to a gate of the second N-type thin film transistor to be the second input end of the NAND gate, and both sources of the two P-type thin film transistors receive the constant high voltage level, and both drains of the two P-type thin film transistors are electrically coupled to a drain of the first N-type thin film transistor to be the output end of the NAND gate, and a source of the first N-type thin film transistor is electrically coupled to a source of the second N-type thin film transistor, and a source of the second N-type thin film transistor receives the constant low voltage level.

As the first direct current control signal provides low voltage level, and the second direct current control signal provides high voltage level, a forward scan is performed; as the first direct current control signal provides high voltage level, and the second direct current control signal provides low voltage level, a backward scan is performed.

The present invention further provides a GOA circuit applied for an In Cell type touch display panel, comprising GOA units of a plurality of stages which are cascade coupled, and the GOA unit of each stage comprises: a forward-backward scan control module, a control input module, a reset module, a latch module, a NAND gate signal process module and an output buffer module;

N is set to be a positive integer, and except the GOA unit of the first stage and the GOA unit of the last stage, in the GOA unit of the Nth stage:

the forward-backward scan control module comprises: a first transmission gate, and a low voltage level control end of the first transmission gate receives a first direct current control signal, and a high voltage level control end receives a second direct current control signal, and an input end is electrically coupled to a first node of the former N−1th GOA unit, and an output end is electrically coupled to the control input module; and a second transmission gate, and a high voltage level control end of the second transmission gate receives the first direct current control signal, and a low voltage level control end receives the second direct current control signal, and an input end is electrically coupled to a first node of the latter N+1th GOA unit, and an output end is electrically coupled to the control input module; a voltage level of the first node of the former N−1th GOA unit is employed to be a forward scan stage transfer signal, and a voltage level of the first node of the latter N+1th GOA unit is employed to be a backward scan stage transfer signal;

the control input module comprises: a first clock control inverter, and a high voltage level control end of the first clock control inverter receives a Mth clock signal, and a low voltage level control end receives a Mth inverted clock signal, and an input end is electrically coupled to the output end of the first transmission gate and the output end of the second transmission gate, and an output end is electrically coupled to a second node;

the reset module comprises: an eleventh P-type thin film transistor, and a gate of the eleventh P-type thin film transistor receives a reset signal, and a source receives a constant high voltage level, and a drain is electrically coupled to the second node;

the latch module comprises: a second clock control inverter, and a low voltage level control end of the second clock control inverter receives the Mth clock signal, and a high voltage level control end receives the Mth inverted clock signal, and an input end is electrically coupled to the first node, and an output end is electrically coupled to the second node; and a first inverter, and an input end of the first inverter is electrically coupled to the second node, and an output end is electrically coupled to the first node;

the NAND gate signal process module comprises: a NAND gate, and a first input end of the NAND gate is electrically coupled to the first node, and a second input end receives a M+2th clock signal, and an output end is electrically coupled to the output buffer module;

the output buffer module comprises:

a second inverter comprising a seventh P-type thin film transistor and an eighth N-type thin film transistor; and a gate of the seventh P-type thin film transistor is electrically coupled to a gate of the eighth N-type thin film transistor to be an input end of the second inverter, and electrically coupled to an output end of the NAND gate, and a drain of the seventh P-type thin film transistor is electrically coupled to a drain of the eighth N-type thin film transistor to be an output end of the second inverter, and a source of the seventh P-type thin film transistor receives a constant high voltage level, and a source of the eighth N-type thin film transistor receives a constant low voltage level;

a third transmission gate comprising a second P-type thin film transistor and a third N-type thin film transistor; a gate of the second P-type thin film transistor is employed to be a low voltage level control end of the third transmission gate to receive a touch control signal, and a gate of the third N-type thin film transistor is employed to be a high voltage level control end of the of the third transmission gate to receive an inverted touch control signal, and a source of the second P-type thin film transistor is electrically coupled to a source of the third N-type thin film transistor, and a drain of the second P-type thin film transistor and a drain of the third N-type thin film transistor are electrically coupled to be an input end and an output end of the third transmission gate, respectively;

a sixth P-type thin film transistor, and a gate of the sixth P-type thin film transistor is electrically coupled to the output end of the second inverter, and a source receives the constant high voltage level, and a drain is electrically coupled to the drain of the second P-type thin film transistor, the drain of the third N-type thin film transistor, and a gate of a ninth P-type thin film transistor;

a first P-type thin film transistor, and a gate of the first P-type thin film transistor receives the inverted touch control signal, and a source receives the constant high voltage level, and a drain is electrically coupled to the drain of the second P-type thin film transistor, the drain of the third N-type thin film transistor, and the gate of the ninth P-type thin film transistor;

a fourth N-type thin film transistor, and a gate of the fourth N-type thin film transistor receives the touch control signal, and a source receives the constant low voltage level, and a drain is electrically coupled to the source of the second P-type thin film transistor, the source of the third N-type thin film transistor, and a gate of a tenth N-type thin film transistor;

a fifth N-type thin film transistor, and a gate of the fifth N-type thin film transistor is electrically coupled to the output end of the second inverter, and a source receives the constant low voltage level, and a drain is electrically coupled to the source of the second P-type thin film transistor, the source of the third N-type thin film transistor, and the gate of the tenth N-type thin film transistor;

the ninth P-type thin film transistor, and a source of the ninth P-type thin film transistor receives the constant high voltage level, and a drain is electrically coupled to a gate scan driving signal output end;

the tenth N-type thin film transistor, and a source of the tenth N-type thin film transistor receives the constant low voltage level, and a drain is electrically coupled to the gate scan driving signal output end;

the voltage levels of the first direct current control signal and the second direct current control signal are opposite;

in a normal display stage, the touch control signal (TCK) is low voltage level, and the inverted touch control signal is high voltage level, and the touch scan driving signal provides low voltage level; in a touch scan stage, the touch control signal is high voltage level, and the inverted touch control signal is low voltage level, and the touch scan driving signal provides a periodic pulse signal, and the gate scan driving signal output end is floating, and the outputted gate scan driving signal appears in a high impedance state, and jumps between high, low voltage levels along with that the touch scan driving signal jumps between high, low voltage levels;

wherein in the first stage GOA unit, the input end of the first transmission gate receives a start signal of the circuit;

wherein in the last stage GOA unit, the input end of the second transmission gate receives a start signal of the circuit;

wherein the first inverter comprises: an N-type thin film transistor and a P-type thin film transistor, and a gate of the N-type thin film transistor is electrically coupled to a gate of the P-type thin film transistor to be an input end, and a drain of the N-type thin film transistor is electrically coupled to a drain of the P-type thin film transistor to be an output end, and a source of the N-type thin film transistor receives the constant low voltage level, and a drain of the P-type thin film transistor receives the constant high voltage level.

The benefits of the present invention are: the present invention provides a GOA circuit applied for the In Cell type touch display panel. By redesigning the output buffer module, the third transmission gate comprising the second P-type thin film transistor and the third N-type thin film transistor, the first P-type thin film transistor and the fourth N-type thin film transistor are added in the output buffer module, and the touch control signal and the inverted touch control signal are introduced to control the working status of the output buffer module. Thus, in the normal display stage, the third transmission gate is activated, and the first, the fourth thin film transistors are deactivated, and the output buffer module normally outputs the gate scan driving signal. However, in the touch scan stage, the third transmission gate is deactivated, and the first, the fourth thin film transistors are activated, and the gate scan driving signal output end is floating, and the outputted gate scan driving signal appears in a high impedance state, and similarly jumps between high, low voltage levels along with that the touch scan driving signal jumps between high, low voltage levels, and the loading of the IC for the signal process in the touch scan stage can be reduced to promote the working efficiency of the GOA circuit.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
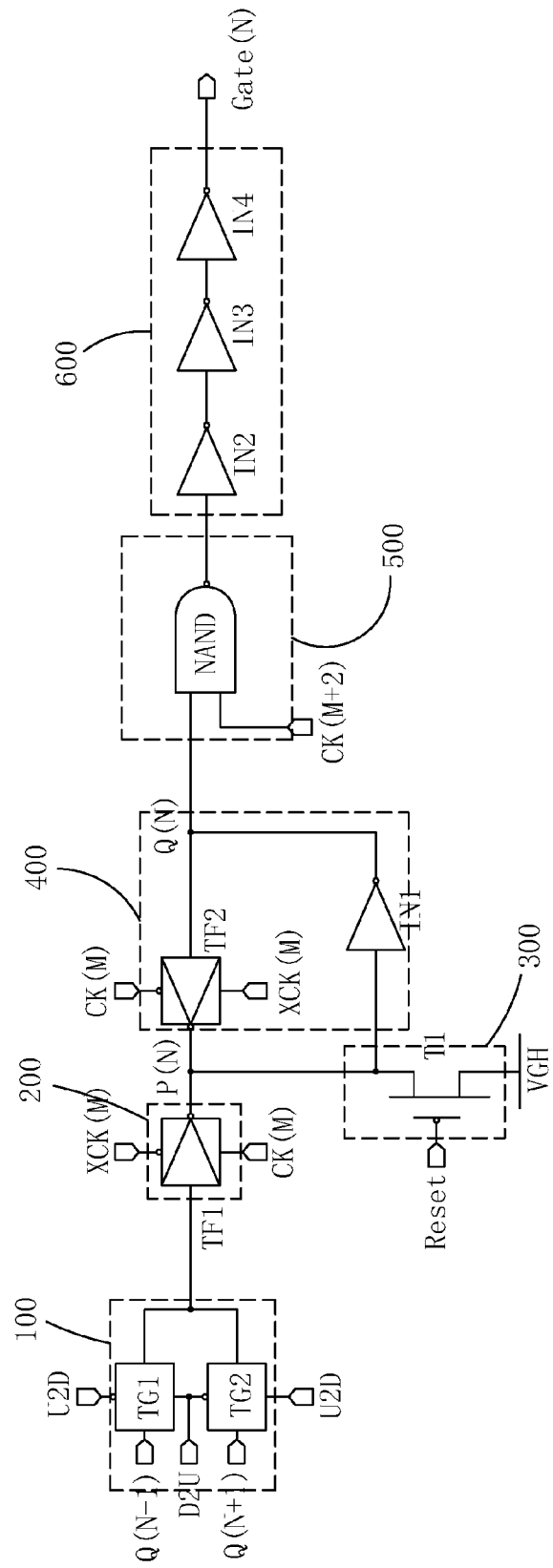
FIG. 1 is a circuit diagram of a GOA circuit applied for an In Cell type touch display panel according to prior art.
Figure 2:
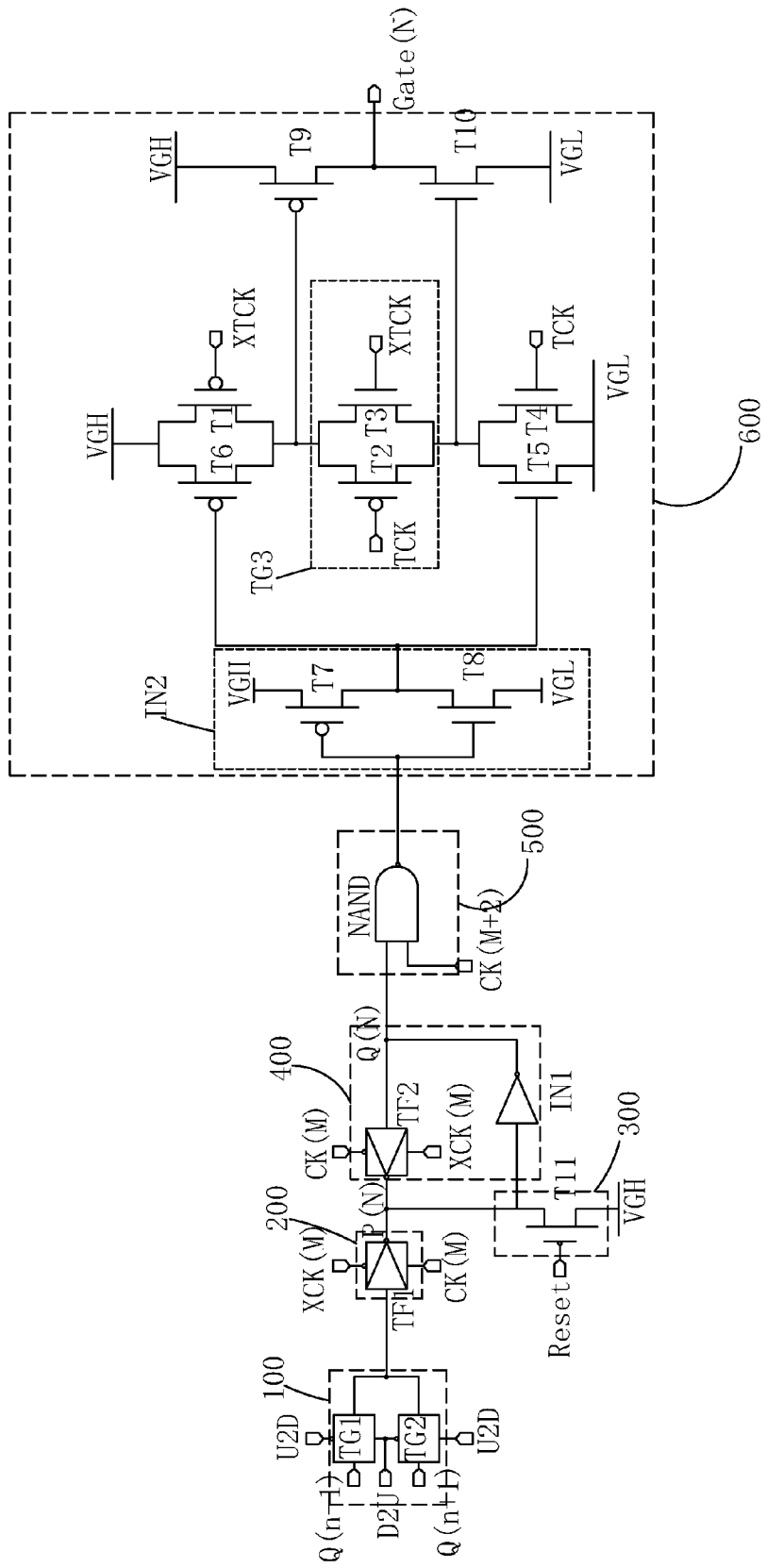
FIG. 2 is a circuit diagram of a GOA circuit applied for an In Cell type touch display panel according to the present invention.
Figure 5:
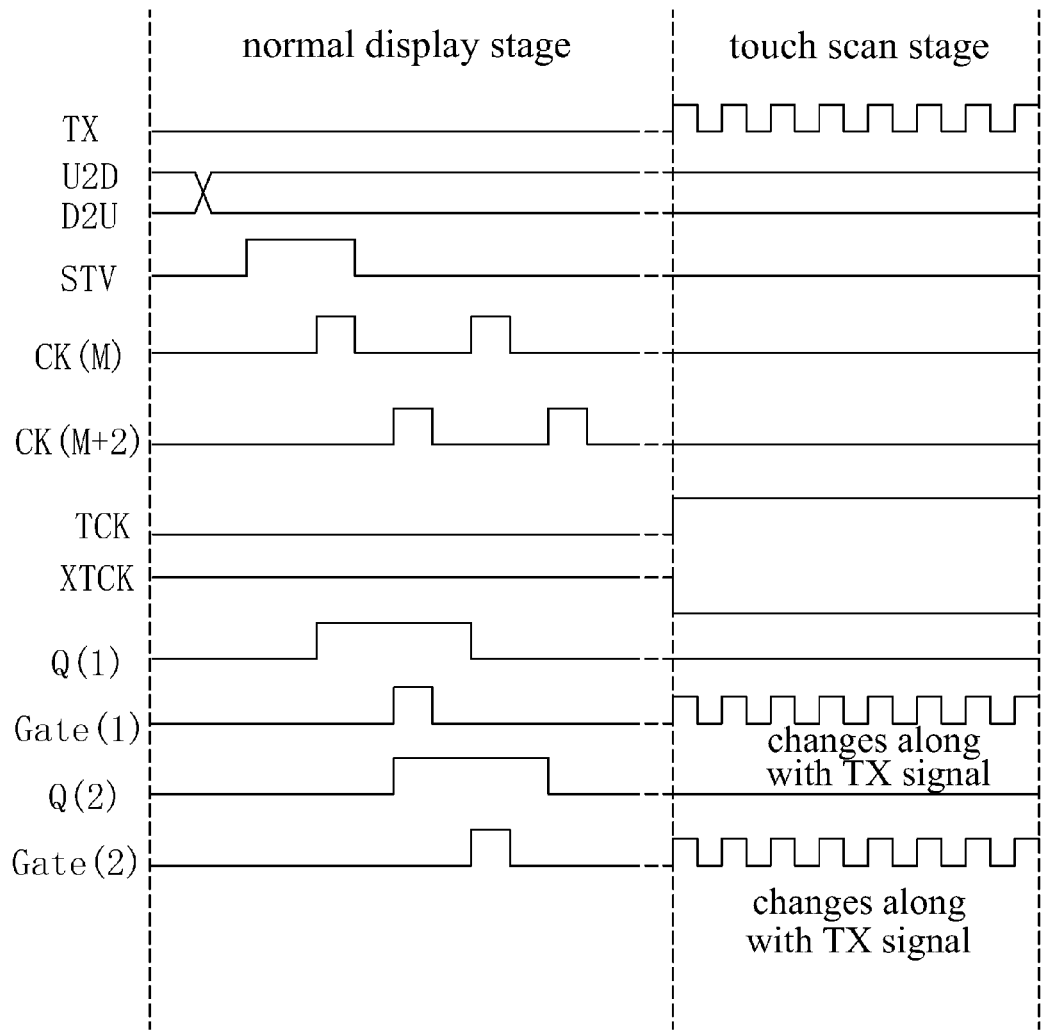
FIG. 5 is a sequence diagram of the GOA circuit applied for an In Cell type touch display panel according to the present invention.

Please refer to FIG. 2 and FIG. 5, the present invention provides a GOA circuit applied for an In Cell type touch display panel, comprising GOA units of a plurality of stages which are cascade coupled, and the GOA unit of each stage comprises: a forward-backward scan control module 100, a control input module 200, a reset module 300, a latch module 400, a NAND gate signal process module 500 and an output buffer module 600.

N is set to be a positive integer, and except the GOA unit of the first stage and the GOA unit of the last stage, in the GOA unit of the Nth stage:

the forward-backward scan control module 100 comprises: a first transmission gate TG1, and a low voltage level control end of the first transmission gate TG1 receives a first direct current control signal U2D, and a high voltage level control end receives a second direct current control signal D2U, and an input end is electrically coupled to a first node Q(N−1) of the former N−1th GOA unit, and an output end is electrically coupled to the control input module 200; and a second transmission gate TG2, and a high voltage level control end of the second transmission gate TG2 receives the first direct current control signal U2D, and a low voltage level control end receives the second direct current control signal D2U, and an input end is electrically coupled to a first node Q(N+1) of the latter N+1th GOA unit, and an output end is electrically coupled to the control input module 200; a voltage level of the first node Q(N−1) of the former N−1th GOA unit is employed to be a forward scan stage transfer signal, and a voltage level of the first node Q(N+1) of the latter N+1th GOA unit is employed to be a backward scan stage transfer signal;

the control input module 200 comprises: a first clock control inverter TF1, and a high voltage level control end of the first clock control inverter TF1 receives a Mth clock signal CK(M), and a low voltage level control end receives a Mth inverted clock signal XCK(M), and an input end is electrically coupled to the output end of the first transmission gate TG1 and the output end of the second transmission gate TG2, and an output end is electrically coupled to a second node P(N);

the reset module 300 comprises: an eleventh P-type thin film transistor T11, and a gate of the eleventh P-type thin film transistor T11 receives a reset signal Reset, and a source receives a constant high voltage level VGH, and a drain is electrically coupled to the second node P(N);

the latch module 400 comprises: a second clock control inverter TF2, and a low voltage level control end of the second clock control inverter TF2 receives the Mth clock signal CK(M), and a high voltage level control end receives the Mth inverted clock signal XCK(M), and an input end is electrically coupled to the first node Q(N), and an output end is electrically coupled to the second node P(N); and a first inverter IN1, and an input end of the first inverter IN1 is electrically coupled to the second node P(N), and an output end is electrically coupled to the first node Q(N);

the NAND gate signal process module 500 comprises: a NAND gate NAND, and a first input end of the NAND gate NAND is electrically coupled to the first node Q(N), and a second input end receives a M+2th clock signal CK(M+2), and an output end is electrically coupled to the output buffer module 600;

the output buffer module 600 comprises:

a second inverter IN2 comprising a seventh P-type thin film transistor T7 and an eighth N-type thin film transistor T8; and a gate of the seventh P-type thin film transistor T7 is electrically coupled to a gate of the eighth N-type thin film transistor T8 to be an input end of the second inverter IN2, and electrically coupled to an output end of the NAND gate NAND, and a drain of the seventh P-type thin film transistor T7 is electrically coupled to a drain of the eighth N-type thin film transistor T8 to be an output end of the second inverter IN2, and a source of the seventh P-type thin film transistor T7 receives a constant high voltage level, and a source of the eighth N-type thin film transistor T8 receives a constant low voltage level VGL;

a third transmission gate TG3 comprising a second P-type thin film transistor T2 and a third N-type thin film transistor T3; a gate of the second P-type thin film transistor T2 is employed to be a low voltage level control end of the third transmission gate TG3 to receive a touch control signal TCK, and a gate of the third N-type thin film transistor T3 is employed to be a high voltage level control end of the of the third transmission gate TG3 to receive an inverted touch control signal XTCK, and a source of the second P-type thin film transistor T2 is electrically coupled to a source of the third N-type thin film transistor T3, and a drain of the second P-type thin film transistor T2 and a drain of the third N-type thin film transistor T3 are electrically coupled to be an input end and an output end of the third transmission gate TG3, respectively;

a sixth P-type thin film transistor T6, and a gate of the sixth P-type thin film transistor T6 is electrically coupled to the output end of the second inverter IN2, and a source receives the constant high voltage level VGH, and a drain is electrically coupled to the drain of the second P-type thin film transistor T2, the drain of the third N-type thin film transistor T3, and a gate of a ninth P-type thin film transistor T9;

a first P-type thin film transistor T1, and a gate of the first P-type thin film transistor T1 receives the inverted touch control signal XTCK, and a source receives the constant high voltage level VGH, and a drain is electrically coupled to the drain of the second P-type thin film transistor T2, the drain of the third N-type thin film transistor T3, and the gate of the ninth P-type thin film transistor T9;

a fourth N-type thin film transistor T4, and a gate of the fourth N-type thin film transistor T4 receives the touch control signal TCK, and a source receives the constant low voltage level VGL, and a drain is electrically coupled to the source of the second P-type thin film transistor T2, the source of the third N-type thin film transistor T3, and a gate of a tenth N-type thin film transistor T9;

a fifth N-type thin film transistor T5, and a gate of the fifth N-type thin film transistor T5 is electrically coupled to the output end of the second inverter IN2, and a source receives the constant low voltage level VGL, and a drain is electrically coupled to the source of the second P-type thin film transistor T2, the source of the third N-type thin film transistor T3, and the gate of the tenth N-type thin film transistor T10;

the ninth P-type thin film transistor T9, and a source of the ninth P-type thin film transistor T9 receives the constant high voltage level VGH, and a drain is electrically coupled to a gate scan driving signal output end Gate(N);

the tenth N-type thin film transistor T10, and a source of the tenth N-type thin film transistor T10 receives the constant low voltage level VGL, and a drain is electrically coupled to the gate scan driving signal output end Gate(N).

Figure 3:
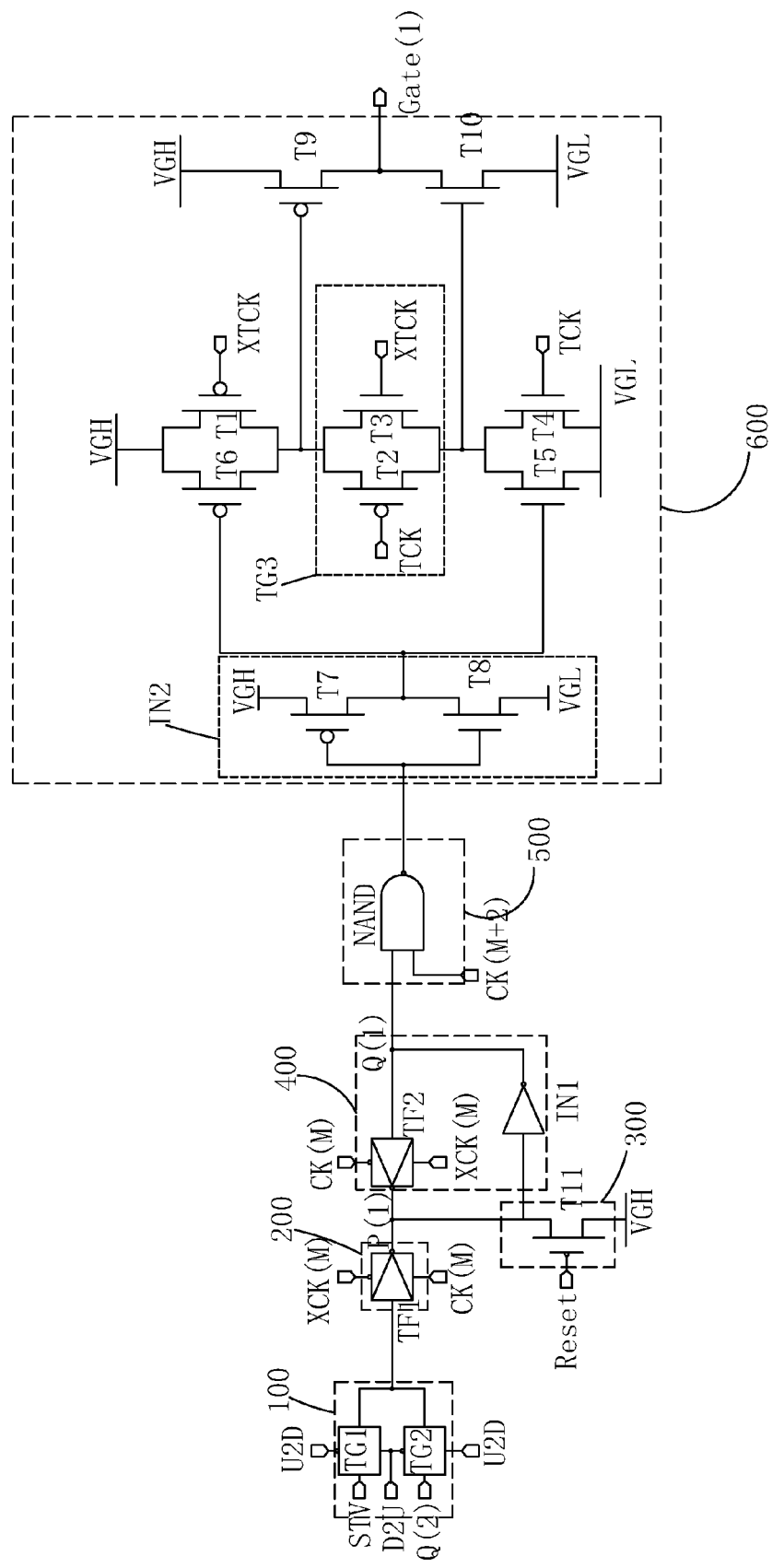
FIG. 3 is a circuit diagram of the first stage GOA unit of the GOA circuit applied for an In Cell type touch display panel according to the present invention.
Figure 4:
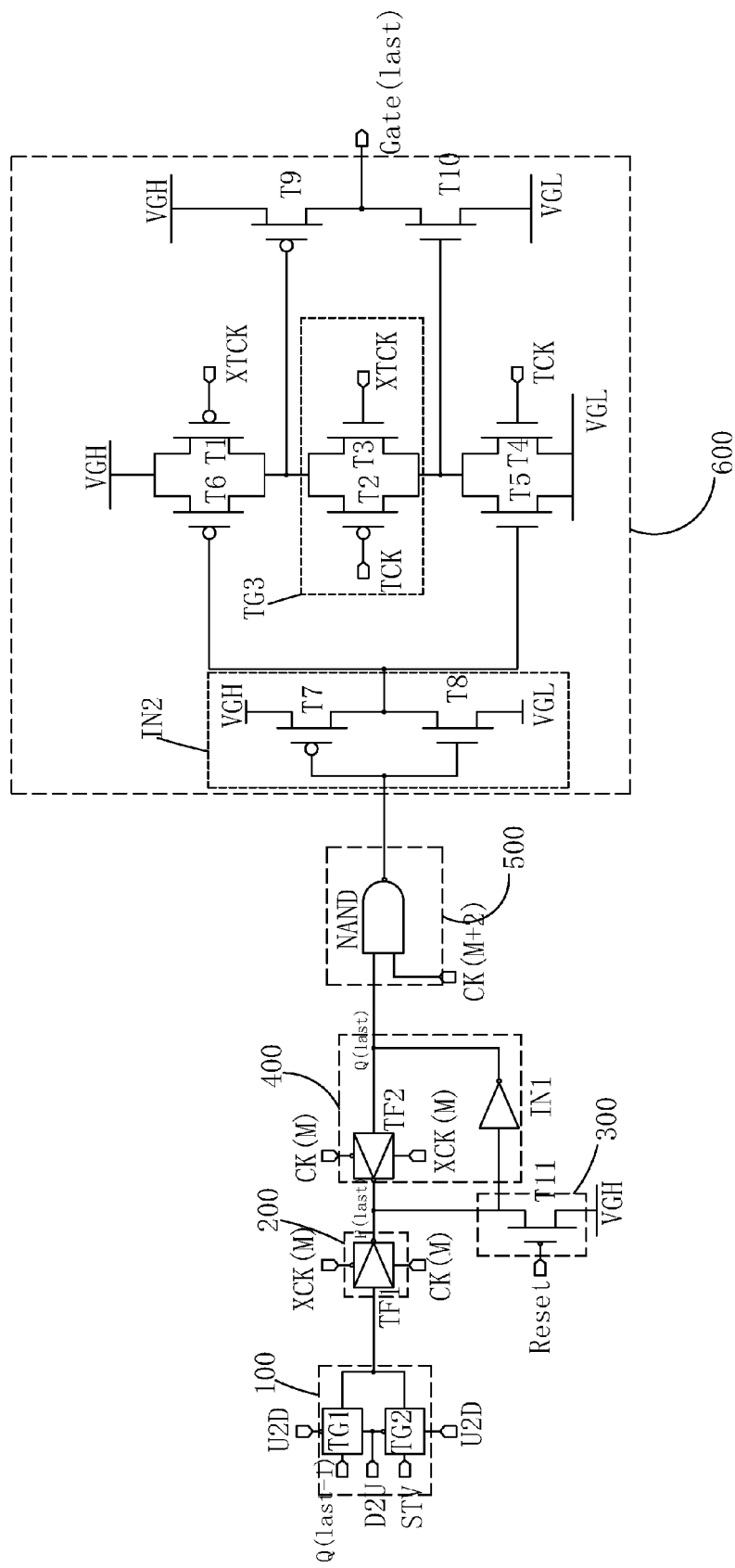
FIG. 4 is a circuit diagram of the last stage GOA unit of the GOA circuit applied for an In Cell type touch display panel according to the present invention.

Particularly, referring to FIG. 3, in the first stage GOA unit, the input end of the first transmission gate TG1 receives a start signal STV of the circuit; referring to FIG. 4, in the last stage GOA unit, the input end of the second transmission gate TG2 receives a start signal STV of the circuit.

Figure 6:
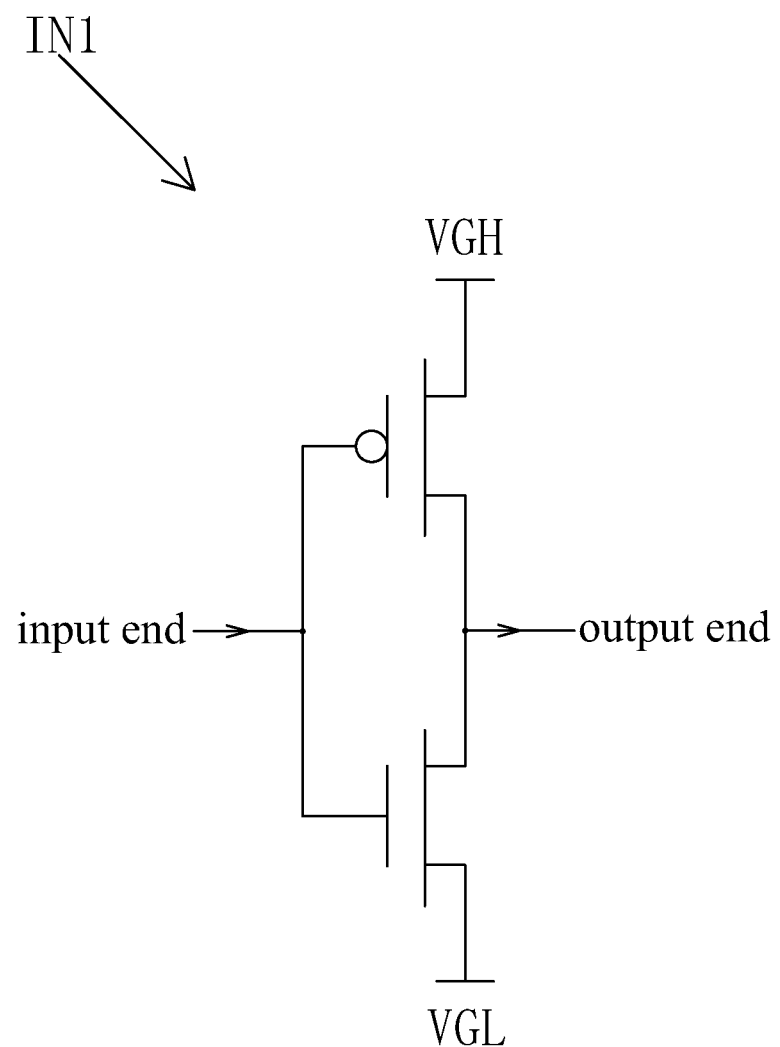
FIG. 6 is a specific circuit structure diagram of the first inverter in the GOA circuit applied for an In Cell type touch display panel according to the present invention.

Specifically, referring to FIG. 6, the first inverter IN1 comprises: an N-type thin film transistor and a P-type thin film transistor, and a gate of the N-type thin film transistor is electrically coupled to a gate of the P-type thin film transistor to be an input end, and a drain of the N-type thin film transistor is electrically coupled to a drain of the P-type thin film transistor to be an output end, and a source of the N-type thin film transistor receives the constant low voltage level VGL, and a drain of the P-type thin film transistor receives the constant high voltage level VGH. As the input end receives the high voltage level signal, the N-type thin film transistor is activated, and the output end outputs low voltage level; as the input end receives the low voltage level signal, the P-type thin film transistor is activated, and the output end outputs high voltage level.

Figure 7:
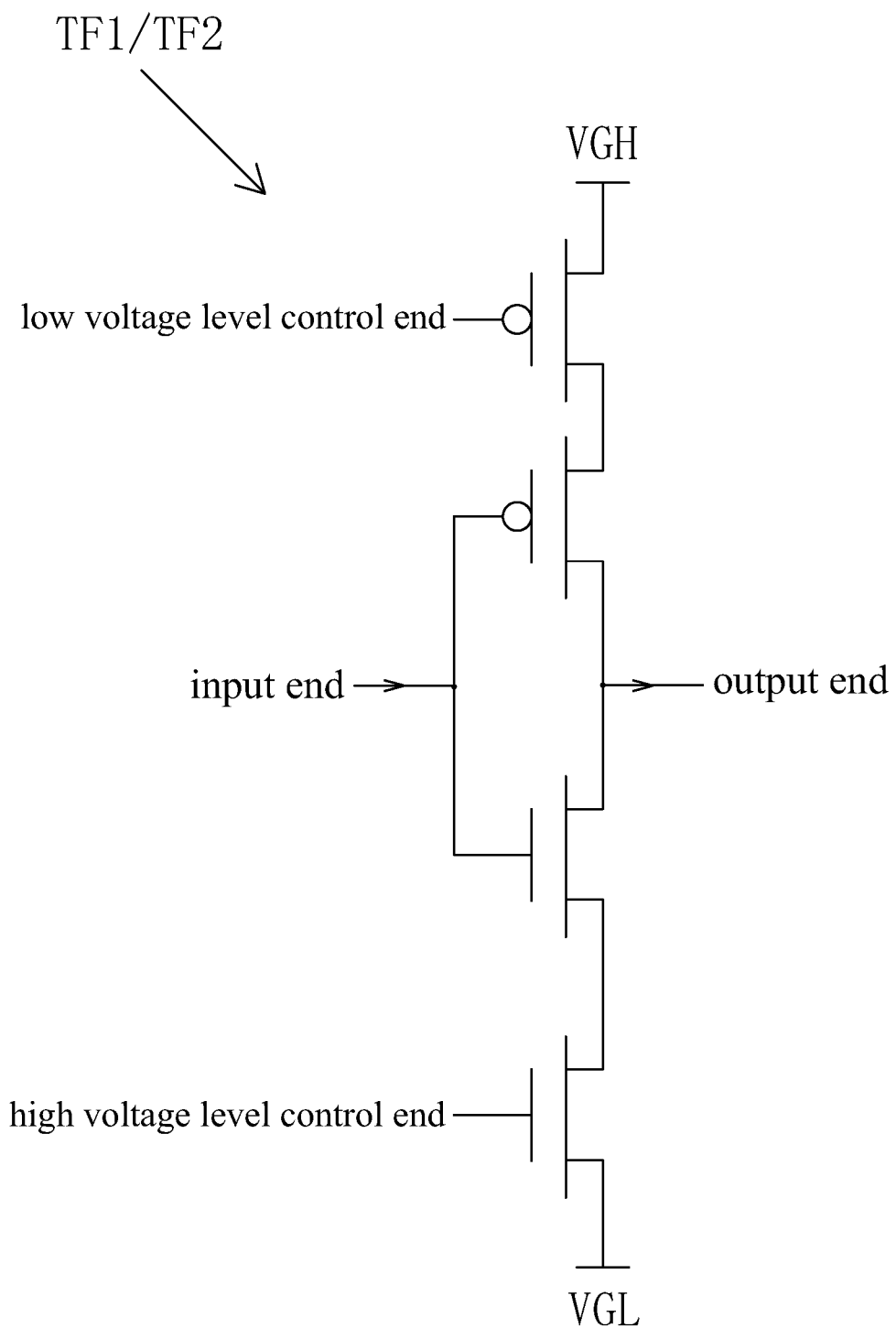
FIG. 7 is a specific circuit structure diagram of the first and the second clock control inverters in the GOA circuit applied for an In Cell type touch display panel according to the present invention.

Please refer to FIG. 7, both the first clock control inverter and the second clock control inverter TF1, TF2 comprise: two N-type thin film transistors coupled in series and two P-type thin film transistors coupled in series, wherein a gate of one P-type thin film transistor is employed to be the low voltage level control end of the clock control inverter, and a source receives the constant high voltage level VGH, and a drain is electrically coupled to a source of the other P-type thin film transistor; a gate of one N-type thin film transistor is employed to be the high voltage level control end of the clock control inverter, and a source receives the constant low voltage level VGL, and a drain is electrically coupled to a source of the other N-type thin film transistor; a gate of the other N-type thin film transistor is electrically coupled to a gate of the other P-type thin film transistor to be the input end of the clock control inverter, and a drain of the other N-type thin film transistor is electrically coupled to a drain of the other P-type thin film transistor to be the output end of the clock control inverter. Only under the premise that the low voltage control end receives the low voltage level signal, and the high voltage level control end receives high voltage level: as the input end receives the high voltage level signal, both the two N-type thin film transistor in series are activated, and the output end outputs low voltage level; as the input end receives the low voltage level signal, both the two P-type thin film transistor in series are activated, and the output end outputs high voltage level.

Figure 8:
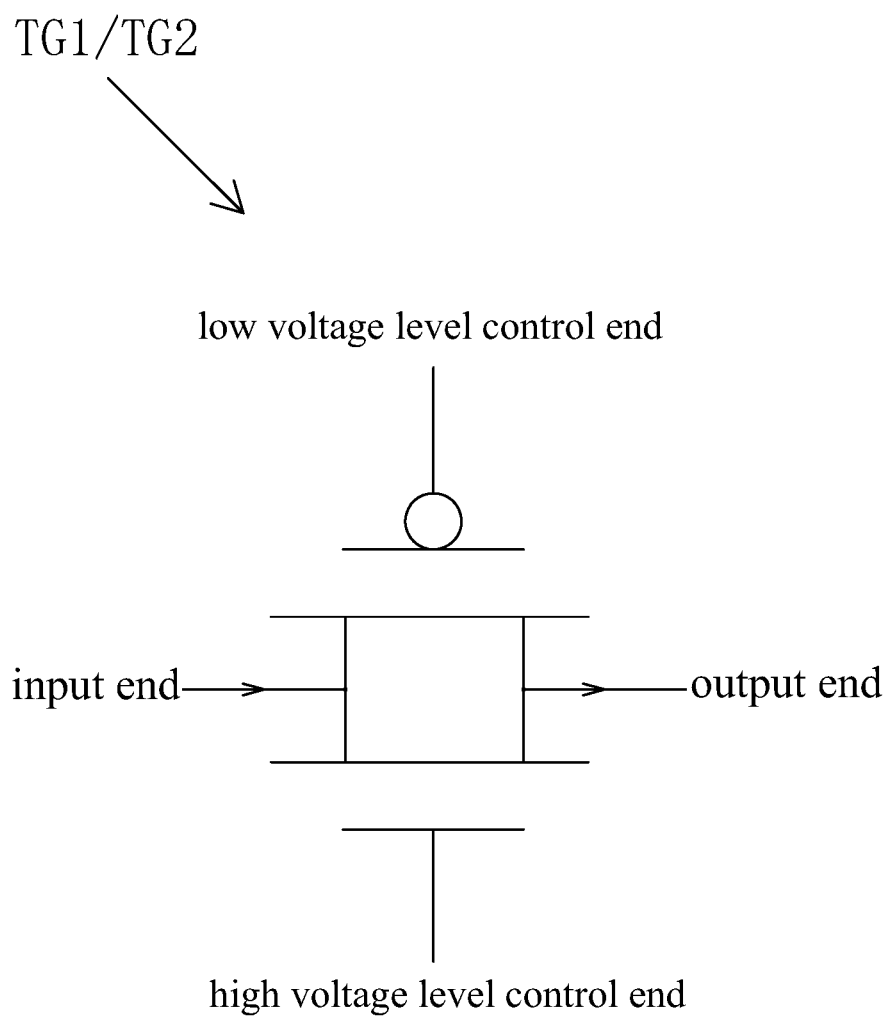
FIG. 8 is a specific circuit structure diagram of the first and the second transmission gates in the GOA circuit applied for an In Cell type touch display panel according to the present invention.

Please refer to FIG. 8, both the first transmission gate and the second transmission gate TG1, TG2 comprises: a N-type thin film transistor and a P-type thin film transistor which are oppositely located, and a gate of the N-type thin film transistor is employed to be the high voltage level control end of the transmission gate, and a gate of the P-type thin film transistor is employed to be the low voltage level control end of the transmission gate, and a source of the N-type thin film transistor is electrically coupled to a source of the P-type thin film transistor to be the input end of the transmission gate, and a drain of the N-type thin film transistor is electrically coupled to a drain of the P-type thin film transistor to be the output end of the transmission gate. Only as the low voltage control end receives the low voltage level signal, and the high voltage level control end receives high voltage level, the transmission gate is on, and the input end and the output end are conducted.

Figure 9:
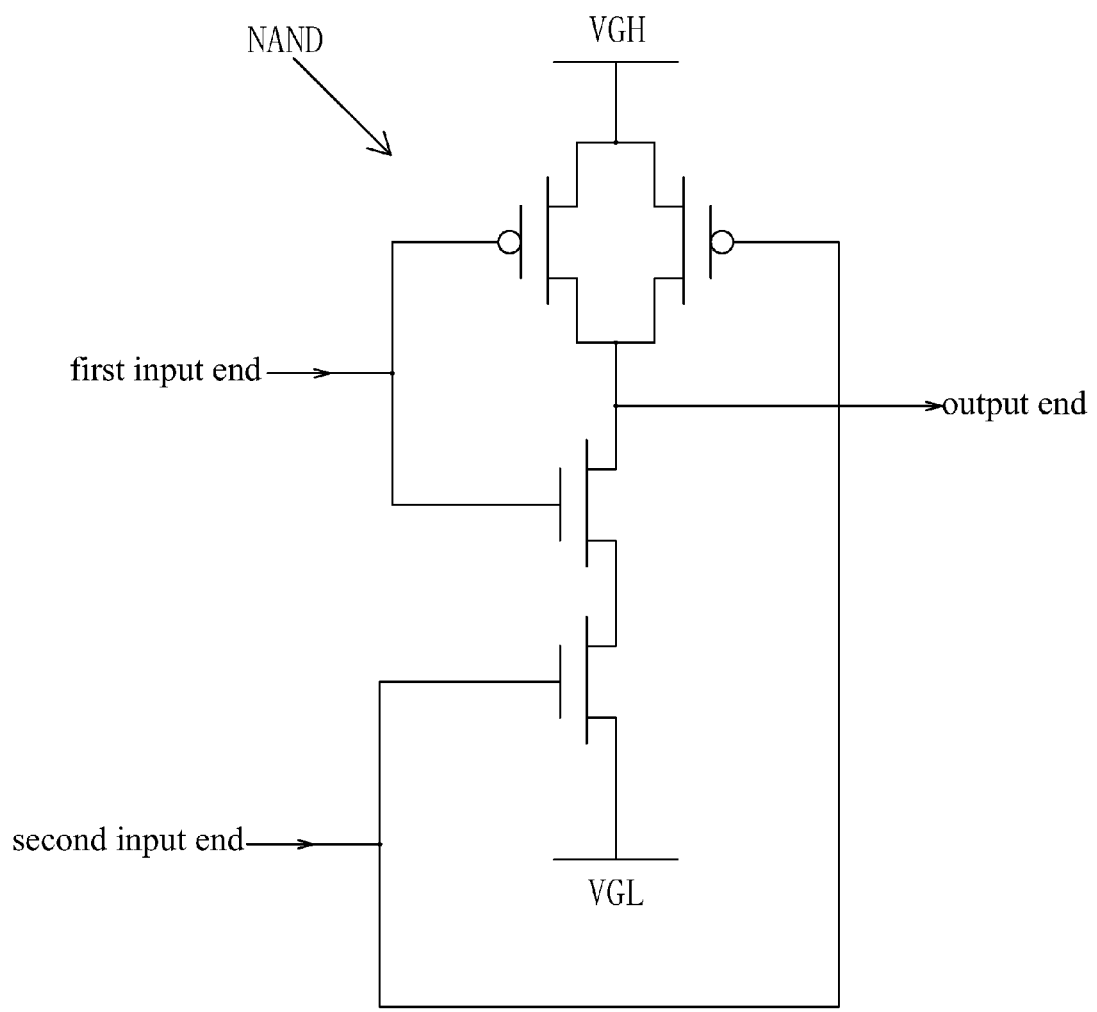
FIG. 9 is a specific circuit structure diagram of the NAND gate in the GOA circuit applied for an In Cell type touch display panel according to the present invention.

Please refer to FIG. 9. The NAND gate NAND comprises: two N-type thin film transistors in series and two P-type thin film transistors oppositely located thereto, wherein a gate of the first P-type thin film transistor is electrically coupled to a gate of the first N-type thin film transistor to be the first input end of the NAND gate, and a gate of the second P-type thin film transistor is electrically coupled to a gate of the second N-type thin film transistor to be the second input end of the NAND gate, and both sources of the two P-type thin film transistors receive the constant high voltage level VGH, and both drains of the two P-type thin film transistors are electrically coupled to a drain of the first N-type thin film transistor to be the output end of the NAND gate, and a source of the first N-type thin film transistor is electrically coupled to a source of the second N-type thin film transistor, and a source of the second N-type thin film transistor receives the constant low voltage level VGL. Only in case that both the first input end and the second input end receive the high voltage level signals, both the two N-type thin film transistors in series are activated, and the output end outputs low voltage level; as long as at least one of the first input end and the second input end receives the low voltage level signal, there will be the P-type thin film transistor activated, and the output end outputs high voltage level. Furthermore, the inverted clock signal is obtained by inputting the clock signal into an inverter. For instance, the Mth clock signal is inputted into the inverter to obtain the Mth inverted clock signal.

The In Cell type touch display panel according to the present invention can performs the forward scan and the backward scan, too: the voltage levels of the first direct current control signal U2D and the second direct current control signal D2U are opposite, as the first direct current control signal U2D provides low voltage level and the second direct current control signal D2U provides high voltage level, the forward scan is performed; as the first direct current control signal U2D provides high voltage level and the second direct current control signal D2U provides low voltage level, the backward scan is performed. Please refer to FIG. 2 and FIG. 5. The forward scan is illustrated. The working process of the GOA circuit applied for the In Cell type touch display panel according to the present invention comprises two stages, the normal display stage and the touch scan stage, which specifically are:

first, entering the normal display stage, in the normal display stage, the touch scan driving signal Tx constantly provides low voltage level, and the touch control signal TCK is low voltage level, and the inverted touch control signal XTCK is high voltage level, and the third transmission gate TG3 in the output buffer module is activated, i.e. both the second P-type thin film transistor T2 and the third N-type thin film transistor T3 are activated, and meanwhile, both the first P-type thin film transistor T1 and the fourth N-type thin film transistor T4 are deactivated.

Furthermore, the normal display stage is divided:

stage 1, the first node Q(N−1) of the former N−1th GOA unit (the start signal STV of the circuit in the first stage GOA unit) provides high voltage level, i.e. the stage transfer signal is high voltage level, and because in the forward scan, the first direct current control signal U2D provides low voltage level and the second direct current control signal D2U provides high voltage level, and the first transmission gate TG1 functions to transmit the high voltage level of the stage transfer signal to the first clock control inverter TF1, and then the Mth clock signal CK(M) provides high voltage level, and the first inverted clock signal XCK(M) provides low voltage level, and the first clock control inverter TF1 is activated, and the second clock control inverter TF2 is deactivated, and the output end of the first clock control inverter TF1 outputs low voltage level, i.e. the second node P(N) is low voltage level, and the low voltage level is converted into high voltage level with the first inverter IN1 for being provided to the first node Q(N);

stage 2, the Mth clock signal CK(M) is changed to be low voltage level, and the first inverted clock signal XCK(M) is changed to be high voltage level, and the second clock control inverter TF2 is activated, and the first clock control inverter TF1 is deactivated, and the high voltage level of the first node Q(N) is latched under the function of the second clock control inverter TF2 and the first inverter IN1, and the NAND gate NAND outputs high voltage level, and outputs low voltage level through the second inverter IN2, and the sixth thin film transistor T6 is activated, and the constant high voltage level VGH is transmitted to the gate of the tenth thin film transistor T10 through the activated third transmission gate TG3, and the tenth thin film transistor T10 is activated, and the gate scan driving output end Gate(N) outputs the constant low voltage level VGL;

stage 3, the M+2th clock signal CK(M+2) provides high voltage level, and the first node Q(N) remains to be latched to be high voltage level, and the NAND gate NAND outputs low voltage level, and outputs high voltage level through the second inverter IN2, and the fifth N-type thin film transistor T5 is activated, and the constant low voltage level VGL is transmitted to the gate of the ninth P-type thin film transistor T9 through the activated third transmission gate TG3, and the ninth P-type thin film transistor T9 is activated, and the gate scan driving output end Gate(N) outputs the constant high voltage level VGH;

stage 4, and then, the M+2th clock signal CK(M+2) is changed to be low voltage level, and the gate scan driving output end Gate(N) outputs the constant low voltage level VGL;

stage 5, the Mth clock signal CK(M) provides high voltage level, again, and the first node Q(N−1) of the former N−1th GOA unit provides low voltage level, and provides high voltage level to the second node P(n) through the first transmission gate TG1 and the first clock control inverter TF1, and furthermore, provides low voltage level to the first node Q(N) through the first inverter IN1, and then the first node Q(N) is latched to be low voltage level, and the gate scan driving output end Gate(N) continues to output the constant low voltage level VGL;

after finishing the normal display stage, and entering the touch scan stage, in the touch scan stage, the touch scan driving signal Tx provides the periodic pulse signal, and the touch control signal TCK is changed to be high voltage level; the inverted touch control signal XTCK is changed to be low voltage level to control the third transmission gate TG3 to be deactivated, and meanwhile to control both the first P-type thin film transistor T1 and the fourth N-type thin film transistor T4 to be activated, and the constant high voltage level VGH is transmitted to the gate of the ninth P-type thin film transistor T9 through the first P-type thin film transistor T1, and the ninth P-type thin film transistor T9 is deactivated, and the constant low voltage level VGL is transmitted to the gate of the tenth N-type thin film transistor T10 through the fourth N-type thin film transistor T4, and the tenth N-type thin film transistor T10 is deactivated, either so that the gate scan driving output end (Gate(N)) is floating, and the outputted gate scan driving signal appears in a high impedance state, and similarly jumps between high, low voltage levels along with that the touch scan driving signal Tx jumps between high, low voltage levels. Accordingly, the loading of signal process of the IC in the touch scan stage can be reduced to promote the working efficiency of the GOA circuit.

In conclusion, the present invention provides a GOA circuit applied for the In Cell type touch display panel. By redesigning the output buffer module, the third transmission gate comprising the second P-type thin film transistor and the third N-type thin film transistor, the first P-type thin film transistor and the fourth N-type thin film transistor are added in the output buffer module, and the touch control signal and the inverted touch control signal are introduced to control the working status of the output buffer module. Thus, in the normal display stage, the third transmission gate is activated, and the first, the fourth thin film transistors are deactivated, and the output buffer module normally outputs the gate scan driving signal. However, in the touch scan stage, the third transmission gate is deactivated, and the first, the fourth thin film transistors are activated, and the gate scan driving signal output end is floating, and the outputted gate scan driving signal appears in a high impedance state, and similarly jumps between high, low voltage levels along with that the touch scan driving signal jumps between high, low voltage levels, and the loading of the IC for the signal process in the touch scan stage can be reduced to promote the working efficiency of the GOA circuit.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A GOA circuit applied for an In Cell type touch display panel, comprising GOA units of a plurality of stages which are cascade coupled, and the GOA unit of each stage comprises: a forward-backward scan control module, a control input module, a reset module, a latch module, a NAND gate signal process module and an output buffer module;

N is set to be a positive integer, and except the GOA unit of the first stage and the GOA unit of the last stage, in the GOA unit of the Nth stage:

the forward-backward scan control module comprises: a first transmission gate, and a low voltage level control end of the first transmission gate receives a first direct current control signal, and a high voltage level control end receives a second direct current control signal, and an input end is electrically coupled to a first node of the former N−1th GOA unit, and an output end is electrically coupled to the control input module; and a second transmission gate, and a high voltage level control end of the second transmission gate receives the first direct current control signal, and a low voltage level control end receives the second direct current control signal, and an input end is electrically coupled to a first node of the latter N+1th GOA unit, and an output end is electrically coupled to the control input module; a voltage level of the first node of the former N−1th GOA unit is employed to be a forward scan stage transfer signal, and a voltage level of the first node of the latter N+1th GOA unit is employed to be a backward scan stage transfer signal;

the control input module comprises: a first clock control inverter, and a high voltage level control end of the first clock control inverter receives a Mth clock signal, and a low voltage level control end receives a Mth inverted clock signal, and an input end is electrically coupled to the output end of the first transmission gate and the output end of the second transmission gate, and an output end is electrically coupled to a second node;

the reset module comprises: an eleventh P-type thin film transistor, and a gate of the eleventh P-type thin film transistor receives a reset signal, and a source receives a constant high voltage level, and a drain is electrically coupled to the second node;

the latch module comprises: a second clock control inverter, and a low voltage level control end of the second clock control inverter receives the Mth clock signal, and a high voltage level control end receives the Mth inverted clock signal, and an input end is electrically coupled to the first node, and an output end is electrically coupled to the second node; and a first inverter, and an input end of the first inverter is electrically coupled to the second node, and an output end is electrically coupled to the first node;

the NAND gate signal process module comprises: a NAND gate, and a first input end of the NAND gate is electrically coupled to the first node, and a second input end receives a M+2th clock signal, and an output end is electrically coupled to the output buffer module;

the output buffer module comprises:

a second inverter comprising a seventh P-type thin film transistor and an eighth N-type thin film transistor; and a gate of the seventh P-type thin film transistor is electrically coupled to a gate of the eighth N-type thin film transistor to be an input end of the second inverter, and electrically coupled to an output end of the NAND gate, and a drain of the seventh P-type thin film transistor is electrically coupled to a drain of the eighth N-type thin film transistor to be an output end of the second inverter, and a source of the seventh P-type thin film transistor receives a constant high voltage level, and a source of the eighth N-type thin film transistor receives a constant low voltage level;

a third transmission gate comprising a second P-type thin film transistor and a third N-type thin film transistor; a gate of the second P-type thin film transistor is employed to be a low voltage level control end of the third transmission gate to receive a touch control signal, and a gate of the third N-type thin film transistor is employed to be a high voltage level control end of the of the third transmission gate to receive an inverted touch control signal, and a source of the second P-type thin film transistor is electrically coupled to a source of the third N-type thin film transistor, and a drain of the second P-type thin film transistor and a drain of the third N-type thin film transistor are electrically coupled to be an input end and an output end of the third transmission gate, respectively;

a sixth P-type thin film transistor, and a gate of the sixth P-type thin film transistor is electrically coupled to the output end of the second inverter, and a source receives the constant high voltage level, and a drain is electrically coupled to the drain of the second P-type thin film transistor, the drain of the third N-type thin film transistor, and a gate of a ninth P-type thin film transistor;

a first P-type thin film transistor, and a gate of the first P-type thin film transistor receives the inverted touch control signal, and a source receives the constant high voltage level, and a drain is electrically coupled to the drain of the second P-type thin film transistor, the drain of the third N-type thin film transistor, and the gate of the ninth P-type thin film transistor;

a fourth N-type thin film transistor, and a gate of the fourth N-type thin film transistor receives the touch control signal, and a source receives the constant low voltage level, and a drain is electrically coupled to the source of the second P-type thin film transistor, the source of the third N-type thin film transistor, and a gate of a tenth N-type thin film transistor;

a fifth N-type thin film transistor, and a gate of the fifth N-type thin film transistor is electrically coupled to the output end of the second inverter, and a source receives the constant low voltage level, and a drain is electrically coupled to the source of the second P-type thin film transistor, the source of the third N-type thin film transistor, and the gate of the tenth N-type thin film transistor;

the ninth P-type thin film transistor, and a source of the ninth P-type thin film transistor receives the constant high voltage level, and a drain is electrically coupled to a gate scan driving signal output end;

the tenth N-type thin film transistor, and a source of the tenth N-type thin film transistor receives the constant low voltage level, and a drain is electrically coupled to the gate scan driving signal output end;

the voltage levels of the first direct current control signal and the second direct current control signal are opposite;

in a normal display stage, the touch control signal is low voltage level, and the inverted touch control signal is high voltage level, and the touch scan driving signal provides low voltage level; in a touch scan stage, the touch control signal is high voltage level, and the inverted touch control signal is low voltage level, and the touch scan driving signal provides a periodic pulse signal, and the gate scan driving signal output end is floating, and the outputted gate scan driving signal appears in a high impedance state, and jumps between high, low voltage levels along with that the touch scan driving signal jumps between high, low voltage levels.

2. The GOA circuit applied for the In Cell type touch display panel according to claim 1, wherein in the first stage GOA unit, the input end of the first transmission gate receives a start signal of the circuit.

3. The GOA circuit applied for the In Cell type touch display panel according to claim 1, wherein in the last stage GOA unit, the input end of the second transmission gate receives a start signal of the circuit.

4. The GOA circuit applied for the In Cell type touch display panel according to claim 1, wherein the first inverter comprises: an N-type thin film transistor and a P-type thin film transistor, and a gate of the N-type thin film transistor is electrically coupled to a gate of the P-type thin film transistor to be an input end, and a drain of the N-type thin film transistor is electrically coupled to a drain of the P-type thin film transistor to be an output end, and a source of the N-type thin film transistor receives the constant low voltage level, and a drain of the P-type thin film transistor receives the constant high voltage level.

5. The GOA circuit applied for the In Cell type touch display panel according to claim 1, wherein both the first clock control inverter and the second clock control inverter comprise: two N-type thin film transistors coupled in series and two P-type thin film transistors coupled in series, wherein a gate of one P-type thin film transistor is employed to be the low voltage level control end of the clock control inverter, and a source receives the constant high voltage level, and a drain is electrically coupled to a source of the other P-type thin film transistor; a gate of one N-type thin film transistor is employed to be the high voltage level control end of the clock control inverter, and a source receives the constant low voltage level, and a drain is electrically coupled to a source of the other N-type thin film transistor; a gate of the other N-type thin film transistor is electrically coupled to a gate of the other P-type thin film transistor to be the input end of the clock control inverter, and a drain of the other N-type thin film transistor is electrically coupled to a drain of the other P-type thin film transistor to be the output end of the clock control inverter.

6. The GOA circuit applied for the In Cell type touch display panel according to claim 1, wherein both the first transmission gate and the second transmission gate comprises: a N-type thin film transistor and a P-type thin film transistor which are oppositely located, and a gate of the N-type thin film transistor is employed to be the high voltage level control end of the transmission gate, and a gate of the P-type thin film transistor is employed to be the low voltage level control end of the transmission gate, and a source of the N-type thin film transistor is electrically coupled to a source of the P-type thin film transistor to be the input end of the transmission gate, and a drain of the N-type thin film transistor is electrically coupled to a drain of the P-type thin film transistor to be the output end of the transmission gate.

7. The GOA circuit applied for the In Cell type touch display panel according to claim 1, wherein the NAND gate comprises: two N-type thin film transistors in series and two P-type thin film transistors oppositely located thereto, wherein a gate of the first P-type thin film transistor is electrically coupled to a gate of the first N-type thin film transistor to be the first input end of the NAND gate, and a gate of the second P-type thin film transistor is electrically coupled to a gate of the second N-type thin film transistor to be the second input end of the NAND gate, and both sources of the two P-type thin film transistors receive the constant high voltage level, and both drains of the two P-type thin film transistors are electrically coupled to a drain of the first N-type thin film transistor to be the output end of the NAND gate, and a source of the first N-type thin film transistor is electrically coupled to a source of the second N-type thin film transistor, and a source of the second N-type thin film transistor receives the constant low voltage level.

8. The GOA circuit applied for the In Cell type touch display panel according to claim 1, wherein as the first direct current control signal provides low voltage level, and the second direct current control signal provides high voltage level, a forward scan is performed; as the first direct current control signal provides high voltage level, and the second direct current control signal provides low voltage level, a backward scan is performed.

9. A GOA circuit applied for an In Cell type touch display panel, comprising GOA units of a plurality of stages which are cascade coupled, and the GOA unit of each stage comprises: a forward-backward scan control module, a control input module, a reset module, a latch module, a NAND gate signal process module and an output buffer module;

N is set to be a positive integer, and except the GOA unit of the first stage and the GOA unit of the last stage, in the GOA unit of the Nth stage:

the forward-backward scan control module comprises: a first transmission gate, and a low voltage level control end of the first transmission gate receives a first direct current control signal, and a high voltage level control end receives a second direct current control signal, and an input end is electrically coupled to a first node of the former N−1th GOA unit, and an output end is electrically coupled to the control input module; and a second transmission gate, and a high voltage level control end of the second transmission gate receives the first direct current control signal, and a low voltage level control end receives the second direct current control signal, and an input end is electrically coupled to a first node of the latter N+1th GOA unit, and an output end is electrically coupled to the control input module; a voltage level of the first node of the former N−1th GOA unit is employed to be a forward scan stage transfer signal, and a voltage level of the first node of the latter N+1th GOA unit is employed to be a backward scan stage transfer signal;

the control input module comprises: a first clock control inverter, and a high voltage level control end of the first clock control inverter receives a Mth clock signal, and a low voltage level control end receives a Mth inverted clock signal, and an input end is electrically coupled to the output end of the first transmission gate and the output end of the second transmission gate, and an output end is electrically coupled to a second node;

the reset module comprises: an eleventh P-type thin film transistor, and a gate of the eleventh P-type thin film transistor receives a reset signal, and a source receives a constant high voltage level, and a drain is electrically coupled to the second node;

the latch module comprises: a second clock control inverter, and a low voltage level control end of the second clock control inverter receives the Mth clock signal, and a high voltage level control end receives the Mth inverted clock signal, and an input end is electrically coupled to the first node, and an output end is electrically coupled to the second node; and a first inverter, and an input end of the first inverter is electrically coupled to the second node, and an output end is electrically coupled to the first node;

the NAND gate signal process module comprises: a NAND gate, and a first input end of the NAND gate is electrically coupled to the first node, and a second input end receives a M+2th clock signal, and an output end is electrically coupled to the output buffer module;

the output buffer module comprises:

a second inverter comprising a seventh P-type thin film transistor and an eighth N-type thin film transistor; and a gate of the seventh P-type thin film transistor is electrically coupled to a gate of the eighth N-type thin film transistor to be an input end of the second inverter, and electrically coupled to an output end of the NAND gate, and a drain of the seventh P-type thin film transistor is electrically coupled to a drain of the eighth N-type thin film transistor to be an output end of the second inverter, and a source of the seventh P-type thin film transistor receives a constant high voltage level, and a source of the eighth N-type thin film transistor receives a constant low voltage level;

a third transmission gate comprising a second P-type thin film transistor and a third N-type thin film transistor; a gate of the second P-type thin film transistor is employed to be a low voltage level control end of the third transmission gate to receive a touch control signal, and a gate of the third N-type thin film transistor is employed to be a high voltage level control end of the of the third transmission gate to receive an inverted touch control signal, and a source of the second P-type thin film transistor is electrically coupled to a source of the third N-type thin film transistor, and a drain of the second P-type thin film transistor and a drain of the third N-type thin film transistor are electrically coupled to be an input end and an output end of the third transmission gate, respectively;

a sixth P-type thin film transistor, and a gate of the sixth P-type thin film transistor is electrically coupled to the output end of the second inverter, and a source receives the constant high voltage level, and a drain is electrically coupled to the drain of the second P-type thin film transistor, the drain of the third N-type thin film transistor, and a gate of a ninth P-type thin film transistor;

a first P-type thin film transistor, and a gate of the first P-type thin film transistor receives the inverted touch control signal, and a source receives the constant high voltage level, and a drain is electrically coupled to the drain of the second P-type thin film transistor, the drain of the third N-type thin film transistor, and the gate of the ninth P-type thin film transistor;

a fourth N-type thin film transistor, and a gate of the fourth N-type thin film transistor receives the touch control signal, and a source receives the constant low voltage level, and a drain is electrically coupled to the source of the second P-type thin film transistor, the source of the third N-type thin film transistor, and a gate of a tenth N-type thin film transistor;

a fifth N-type thin film transistor, and a gate of the fifth N-type thin film transistor is electrically coupled to the output end of the second inverter, and a source receives the constant low voltage level, and a drain is electrically coupled to the source of the second P-type thin film transistor, the source of the third N-type thin film transistor, and the gate of the tenth N-type thin film transistor;

the ninth P-type thin film transistor, and a source of the ninth P-type thin film transistor receives the constant high voltage level, and a drain is electrically coupled to a gate scan driving signal output end;

the tenth N-type thin film transistor, and a source of the tenth N-type thin film transistor receives the constant low voltage level, and a drain is electrically coupled to the gate scan driving signal output end;

the voltage levels of the first direct current control signal and the second direct current control signal are opposite;

in a normal display stage, the touch control signal (TCK) is low voltage level, and the inverted touch control signal is high voltage level, and the touch scan driving signal provides low voltage level; in a touch scan stage, the touch control signal is high voltage level, and the inverted touch control signal is low voltage level, and the touch scan driving signal provides a periodic pulse signal, and the gate scan driving signal output end is floating, and the outputted gate scan driving signal appears in a high impedance state, and jumps between high, low voltage levels along with that the touch scan driving signal jumps between high, low voltage levels;

wherein in the first stage GOA unit, the input end of the first transmission gate receives a start signal of the circuit;

wherein in the last stage GOA unit, the input end of the second transmission gate receives a start signal of the circuit;

wherein the first inverter comprises: an N-type thin film transistor and a P-type thin film transistor, and a gate of the N-type thin film transistor is electrically coupled to a gate of the P-type thin film transistor to be an input end, and a drain of the N-type thin film transistor is electrically coupled to a drain of the P-type thin film transistor to be an output end, and a source of the N-type thin film transistor receives the constant low voltage level, and a drain of the P-type thin film transistor receives the constant high voltage level.

10. The GOA circuit applied for the In Cell type touch display panel according to claim 9, wherein both the first clock control inverter and the second clock control inverter comprise: two N-type thin film transistors coupled in series and two P-type thin film transistors coupled in series, wherein a gate of one P-type thin film transistor is employed to be the low voltage level control end of the clock control inverter, and a source receives the constant high voltage level, and a drain is electrically coupled to a source of the other P-type thin film transistor; a gate of one N-type thin film transistor is employed to be the high voltage level control end of the clock control inverter, and a source receives the constant low voltage level, and a drain is electrically coupled to a source of the other N-type thin film transistor; a gate of the other N-type thin film transistor is electrically coupled to a gate of the other P-type thin film transistor to be the input end of the clock control inverter, and a drain of the other N-type thin film transistor is electrically coupled to a drain of the other P-type thin film transistor to be the output end of the clock control inverter.

11. The GOA circuit applied for the In Cell type touch display panel according to claim 9, wherein both the first transmission gate and the second transmission gate comprises: a N-type thin film transistor and a P-type thin film transistor which are oppositely located, and a gate of the N-type thin film transistor is employed to be the high voltage level control end of the transmission gate, and a gate of the P-type thin film transistor is employed to be the low voltage level control end of the transmission gate, and a source of the N-type thin film transistor is electrically coupled to a source of the P-type thin film transistor to be the input end of the transmission gate, and a drain of the N-type thin film transistor is electrically coupled to a drain of the P-type thin film transistor to be the output end of the transmission gate.

12. The GOA circuit applied for the In Cell type touch display panel according to claim 9, wherein the NAND gate comprises: two N-type thin film transistors in series and two P-type thin film transistors oppositely located thereto, wherein a gate of the first P-type thin film transistor is electrically coupled to a gate of the first N-type thin film transistor to be the first input end of the NAND gate, and a gate of the second P-type thin film transistor is electrically coupled to a gate of the second N-type thin film transistor to be the second input end of the NAND gate, and both sources of the two P-type thin film transistors receive the constant high voltage level, and both drains of the two P-type thin film transistors are electrically coupled to a drain of the first N-type thin film transistor to be the output end of the NAND gate, and a source of the first N-type thin film transistor is electrically coupled to a source of the second N-type thin film transistor, and a source of the second N-type thin film transistor receives the constant low voltage level.

13. The GOA circuit applied for the In Cell type touch display panel according to claim 9, wherein as the first direct current control signal provides low voltage level, and the second direct current control signal provides high voltage level, a forward scan is performed; as the first direct current control signal provides high voltage level, and the second direct current control signal provides low voltage level, a backward scan is performed.

* * * * *